United States Patent

Doty et al.

[11] Patent Number: 6,130,537
[45] Date of Patent: Oct. 10, 2000

[54] HR MAS NMR COILS WITH MAGIC ANGLE CAPACITORS

[75] Inventors: F David Doty; Yungan Yang, both of Columbia, S.C.

[73] Assignee: Doty Scientific Inc., Columbia, S.C.

[21] Appl. No.: 09/269,944

[22] PCT Filed: Mar. 20, 1998

[86] PCT No.: PCT/US98/05277

§ 371 Date: Jun. 29, 1999

§ 102(e) Date: Jun. 29, 1999

[87] PCT Pub. No.: WO98/41886

PCT Pub. Date: Sep. 24, 1998

Related U.S. Application Data

[60] Provisional application No. 60/041,317, Mar. 20, 1997.
[51] Int. Cl.[7] ............................................. G01V 3/00
[52] U.S. Cl. ............................................. 324/318; 324/321
[58] Field of Search .......................... 324/318, 322, 324/300, 312, 314, 307, 309, 321

[56] References Cited

U.S. PATENT DOCUMENTS

| 5,212,450 | 5/1993 | Murphy-Boesch et al. | 324/322 |
|---|---|---|---|
| 5,365,173 | 11/1994 | Zou et al. | 324/318 |

OTHER PUBLICATIONS

Thomas M. Barbara, 'Cylindrical Demagnetization Fields and Microprobe Design in High–Resolution NMR'*J. Magn. Reson. Ser. A,*109, 265–69, 1994.

D. W. Alderman and D. M. Grant, 'An Efficient Decoupler Coil Design which Reduces Heating in Conductive Samples in Superconducting Spectrometers,'*J. Magn. Reson.,*36, 1979, 447–51.

G. J. Kost, S. E. Anderson, G. B. Matson, and C. B. Conboy, 'A Cylindrical–Window, NMR Probe with Extended Tuning Range for Studies of the Developing Hea t ',*J. Magn. Reson.,*82, 1989, 238–52.

Howard D. Hill, 1Geometric Compensation of Magnetism...2, U.S. Pat. 4,563,648, 1986.

F. David Doty 1Parallel Single–Turn Resonator for NMR2, U. S. Pat. 4,641,098, 1987.

W. A. Edelstein, J. F. Schenck, O. M. Mueller and C. E. Hayes, 1Radio Frequency Field Coil for NMR2, U.S. Pat. 4, 680,548, 1987

F. David Doty, 1Doubly Broadband Triple Resonance or Quad Resonance NMR Probe Circuit2, U.S. Pat. 5,424,625, 1995.

F. David Doty, L. G. Hacker, and J. B. Spitzmesser, 1Supersonic Sample Spinner,2 5,508,615, 1996.

D. G. Cory, J. T. Lewandowski, and W. E. Maas, 1NMR Probe for CP2, 5,539,315, 1996, Bruker, Mass.

US 5,365,173 A (ZOU ET AL) 15 November 1994, (15.11.94) see Fig. 2, col. 6 lines 56–68 and col. 7 lines 1–47.

US 5,212,450 A (MURCHY–BOESCH ET AL) 18 May 1993 (18.05.93) see Fig. 2a, col. 7 lines 22–61.

US 4,654,592 Zens March 31, 1987.

*Primary Examiner*—Louis Arana
*Attorney, Agent, or Firm*—Oppedahl & Larson LLP

[57] ABSTRACT

A method of positioning chip capacitors in the Alderman-Grant and related Half-Turn coils is disclosed that permits substantially improved main field homogeneity in HR MAS and conventional "wideline" NMR coil geometries. Eight capacitors are positioned at the complements of the magic angle with respect to the B1 axis at each end of the coil.

7 Claims, 3 Drawing Sheets

HR MAS NMR COILS WITH MAGIC ANGLE CAPACITORS

RELATED APPLICATIONS

This application claims priority from pending U.S. Provisional Application Ser. No. 60/041,317, filed on Mar. 20, 1997, which is hereby incorporated by reference.

FIELD OF THE INVENTION

The field of this invention is the measurement of nuclear magnetic resonance (NMR and MRI) for the purpose of determining molecular or microscopic structure, and, more particularly, a low-inductance rf coil tuning arrangement for improved $B_0$ homogeneity in Magic Angle Spinning (MAS) NMR.

BACKGROUND OF THE INVENTION

This invention pertains to improving the $B_0$ homogeneity in high resolution (HR) MAS NMR, especially for liquids and semi-solids at high fields, using low-inductance saddle coils on cylindrical surfaces inclined at 54.7° with respect to $B_0$. Related NMR coils are described by Doty in U.S. Pat. No. 4,641,098, and numerous coils are reviewed by James Hyde in 'Surface and Other Local Coils for In Vivo Studies', Vol. 7, of *The Encyclopedia of NMR*, Wiley Press, 1996. A copending application discloses related coils using litz foil, and another copending application discloses novel sample cells for HR MAS. Hill discloses one method of geometric compensation using oval saddle coils for HR NMR in U.S. Pat. No. 4,563,648.

There have been numerous applications of Magic Angle Spinning (MAS) for line narrowing in solid samples for more than two decades. The solid sample is usually contained in a hard ceramic rotor with press-fit turbine caps machined from high-strength high-modulus plastics such as polyimides—see for example, U.S. Pat. No. 5,508,615 by Doty et al (note the extensive list of typographical corrections). The coil has traditionally been a multi-tuned solenoid, as shown by Doty in U.S. Pat. No. 5,424,625, although Cory et al in U.S. Pat. No. 5,539,315 have used a loop-gap resonator in combination with a solenoid. Another copending application discloses thermal buffering and susceptibility compensation to permit the use of transverse coils inside HR MAS solenoids, and this invention is directed toward improving $B_0$ homogeneity of such.

The recent semi-solids MAS applications stem largely from the fact that spinning a cylindrically symmetric sample at the magic angle averages its susceptibility effects to zero. Moreover, spinning at the magic angle averages the inhomogeneities produced by static magnetic cylinders aligned with the magic angle to zero. Hence, high resolution may be obtained with magnetically inhomogeneous samples, such as tissues and semi-solids, and the inhomogeneities produced by the cylindrical portions of the stator, coil, and housing are inconsequential. This is particularly important for applications with limited samples. While the literature is replete with attention to compensation of the magnetism of rf coils for HR NMR, the capacitor magnetism problems have been largely ignored.

Kost et al and the above referenced copending litz-foil application disclose methods of improving the $B_1$ homogeneity of the conventional slotted-resonator, the Alderman-Grant half-turn resonator, and other related coils. However, for small samples at very high fields, performance is limited primarily by the poor $B_0$ homogeneity that comes from the proximity of the four chip capacitors traditionally used in the Alderman-Grant and related HT coils. In high-resolution NMR, these problems have been largely circumvented by using distributed capacitors with cylindrical symmetry, but this approach does not work well in HR MAS because of the severe space constraints imposed by the spinner. Magnetic compensation of the chip capacitors is only partially successful because of the temperature and field dependence of their magnetism.

Various circularly polarized birdcage resonators, as disclosed by Edelstein et al in U.S. Pat. No. 4,680,548, in which 8 or more capacitors are uniformly spaced around the rings at each end, are often used for large samples, and they have also been shown to be usable for samples of the size encountered in HR MAS. However, they are much less efficient and much more difficult to tune than the coils of the present invention for small MAS applications. Compared to single-turn or half-turn coils, current concentrations and hence peak conductor edge heating are greatly reduced in multi-turn transverse (Zens) coils. Also, their high inductance premits the capacitors to be well removed from the region of critical $B_0$ homogeneity, but their high inductance causes severe high-voltage breakdown problems for high-power at high frequencies and limits the frequency at which they may be used.

SUMMARY OF THE INVENTION

A method of positioning chip capacitors in the Alderman-Grant and related Half-Turn (HT) coils is discloses that permits substantially improved $B_0$ homogeneity in HR MAS and conventional "wideline" NMR coil geometries. The four segmenting and tuning capacitors normally positioned at opposite ends of the HT coil and aligned with the $B_1$ axis are replaced by eight capacitors positioned at the complements of the magic angle (54.7°) with respect to the $B_1$ axis at each end. The two capacitors may be paralleled at each node by magnetically compensated arcs. Magic angle capacitor positioning may also be applied to related coils with intersecting loops and to segmented loops in parallel with unsegmented loops.

DETAILED DESCRIPTION OF THE PREFERRED EMBODIMENTS

The optimized parallel-single-turn segmented saddle coil (similar to FIG. 7 of U.S. Pat. No. 4,641,098) shown laid out flat in FIG. 1, which we call the split-half-turn (SHT) coil, has somewhat lower edge-current density than prior art Alderman-Grant-type resonators and improved $B_1$ homogeneity. The SHT coil consists of two paralleled semi-coils, each subtending less than 180° of azimuthal arc, on opposite sides of a cylindrical coilform. The optimized SHT coil solves voltage breakdown problems, but other low-inductance transverse resonators result in more uniform current distributions and hence more reduction in conductor edge heating.

As important as Q, filling factor $h_F$, and $B_1$ homogeneity are, $B_0$ homogeneity is a more critical problem for many HR MAS applications. The four chip capacitors 1, 2, 3, 4 cannot be made strictly non-magnetic. Normally, the electrodes and terminations are 25%Pd–75%Ag, which is highly paramagnetic. Even with special Au—Cu—Ag terminations, the capacitors are always found to have unacceptable and unpredictable susceptibilites, typically in the range of 7 to 12E-6 (SI volumetric units) at 7 T, 300 K. If the capacitors could be distributed in a closely spaced full circle around the MAS sample container and if they all had equal magnetization, the inhomogeneity would largely average to zero under MAS. However, neither condition is easily met—owing to discrete size limitations, magnetization anisotropy, and manufacturing variations.

There are several capacitor arrangements that give substantially improved $B_0$ homogeneity under MAS compared to the prior art. For a 5 mm rotor diameter, the coilform outside diameter is typically 6.2 mm, which would permit a circle of 7 closely spaced capacitors of the typical width—about 2.7 mm. But an even number of capacitors is required for acceptable $B_1$ homogeneity and ease of tuning, which limits the number of capacitors to six (three for each gap) with a little space between each. Such an arrangement results in greatly improved $B_0$ homogeneity compared to the prior art, but capacitor lead routing connections are difficult.

Figure 2:
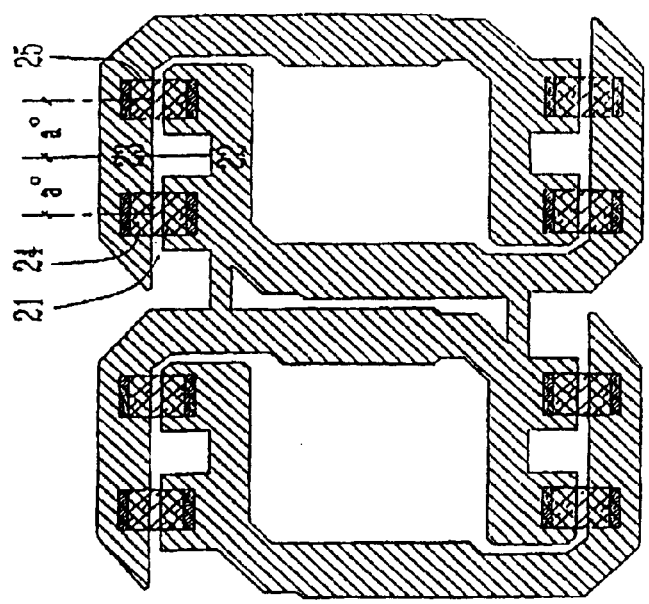
FIG. 2 discloses a method of paralleling magic angle capacitors in the HT coil.
3.

FIG. 2 illustrates a preferred capacitor arrangement that requires only four capacitors at each end, achieves even better resolution, and is much easier to assemble. The segmenting gap 21 at each end of each semi-coil is oriented in the circumferential direction between an inner arc 22 and an outer arc 23. Two ceramic chip capacitors 24, 25 are positioned with respect to the transverse $B_1$ axis at approximate mean azimuthal angle a=35.3°, the complement of the standard magic angle, the angle with respect to $B_0$ at which the dipolar interaction vanishes. At this location, the mean $B_0$ field distortions in the sample regions near the capacitors are nearly zero for a spinner axis transverse to $B_0$. With the spinner axis at the magic angle and the sample spinning, the optimum angle is increased to about 45°, but angles between 25° and 65° are quite advantageous, as this contributes to cylindrical symmetry, which averages to zero under MAS.

Figure 1:
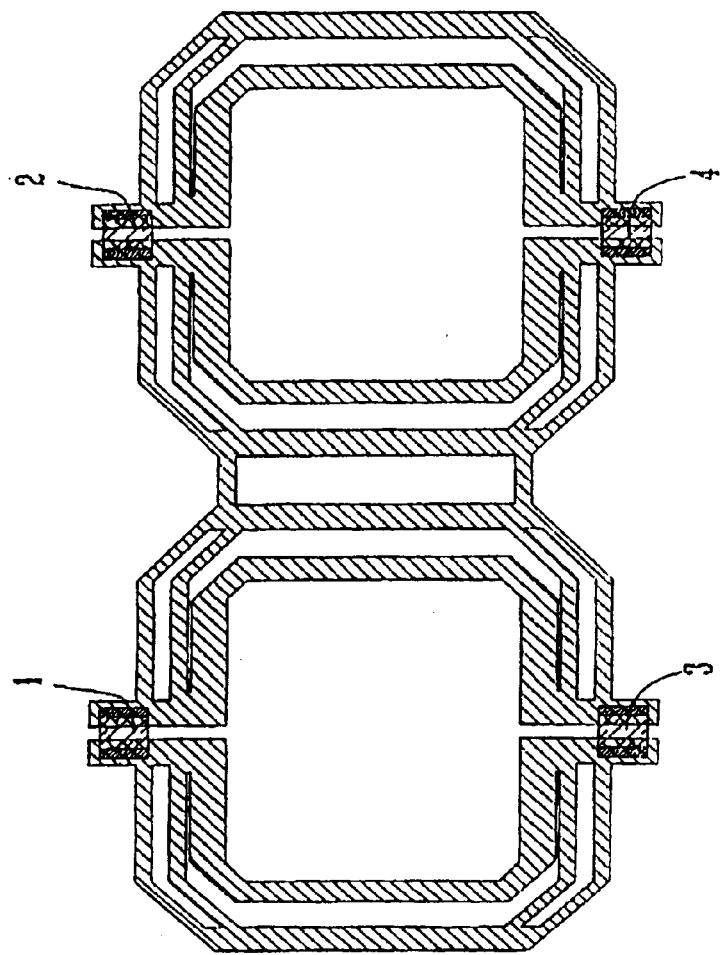
FIG. 1 illustrates the prior art Split-Half-Turn (SHT) coil.
2.

The pattern shown in FIG. 2 achieves $B_1$ homogeneity comparable to that of the conventional HT coil—though inferior to the SHT coil of FIG. 1. As with the prior HT coils, rf voltages near the central plane are zero, and the rf voltages are approximately balanced and equal at each end. The individual capacitors in each pair need not be equal for these conditions to be met, although the sum of the capacitors in each quadrant should be approximately equal. The effective axial field length is approximately equal to the axial distance between the gaps at opposite ends, but may be shifted a little if desired by adjusting the ratio of the capacitors in each pair. As with FIG. 1, at low frequencies the capacitors at one end may be replaced by a short, thereby forming essentially a conventional slotted resonator. As with the prior art, the capacitors at the coil would usually tune the coil slightly high, and leads would be attached across one of the capacitors for fine capacitive tuning and matching.

Figure 3:
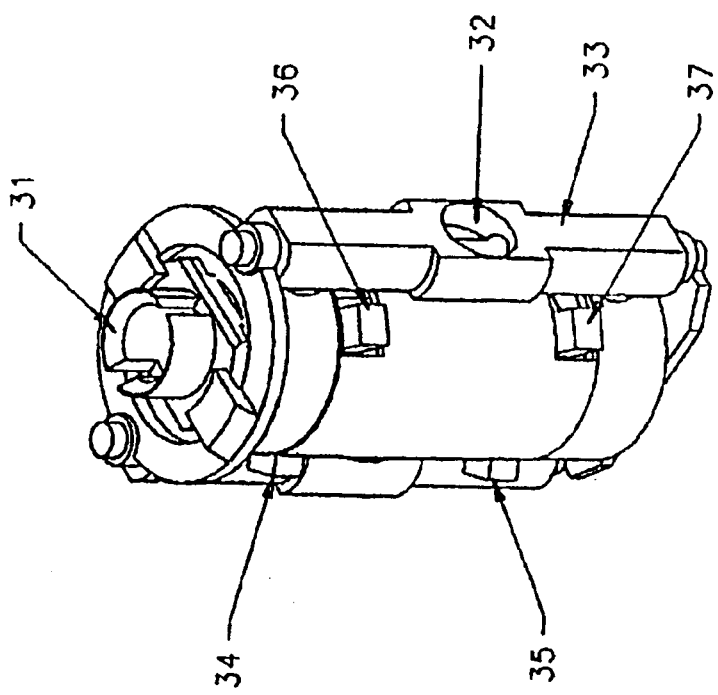
FIG. 3 is a perspective drawing of a completed spinner assembly with magic angle capacitors.
4.

FIG. 3 is an approximate perspective view of an example of an MAS spinner assembly utilizing magic angle capacitors with an HT cross coil. A copending application discloses other features of this particular spinner assembly in more detail. Briefly, the MAS rotor is inserted into the opening 31 at one end. The spinner assembly may be oriented at various angles with respect to $B_0$ while air is supplied through an air coupling/bearing 32 along the axis of orientation to the bearing air tube 33, which supplies bearing manifolds at each end. A similar arrangement on the opposite side supplies the turbine drive gas. Capacitors 34, 35, 36, 37 are shown extending through a cover surrounding the HT coil and solenoid. Four more capacitors are symmetrically located on the back side.

The capacitors in FIG. 3 appear spaced an additional radial distance from the coilform (its diameter may be judged from the size of the opening 31). Mounting the chip capacitors on (diamagnetic, copper or silver) leads several millimeters in length to partially compensate the effects of the paramagnetic capacitors is beneficial in further improving $B_0$ homogeneity, as magic angle positioning only minimizes the most severe field distortions nearest the capacitors. Additional distance to the chips is quite beneficial in further improving $B_0$ homogeneity. With copper leads, the total volume of copper required near the capacitor in the two leads is typically comparable to that of the chip capacitor, as their susceptibilities are comparable but of opposite sign. Silver leads, on the other hand, should be half as large. It should also be noted that the capacitors and coil patterns of the other figures are not indicative of typical relative scale for common high-Q rf capacitors and HT coils for a 5 mm spinner. The capacitors are at roughly two-thirds the scale of a coil for a 5 mm spinner.

Figure 4:
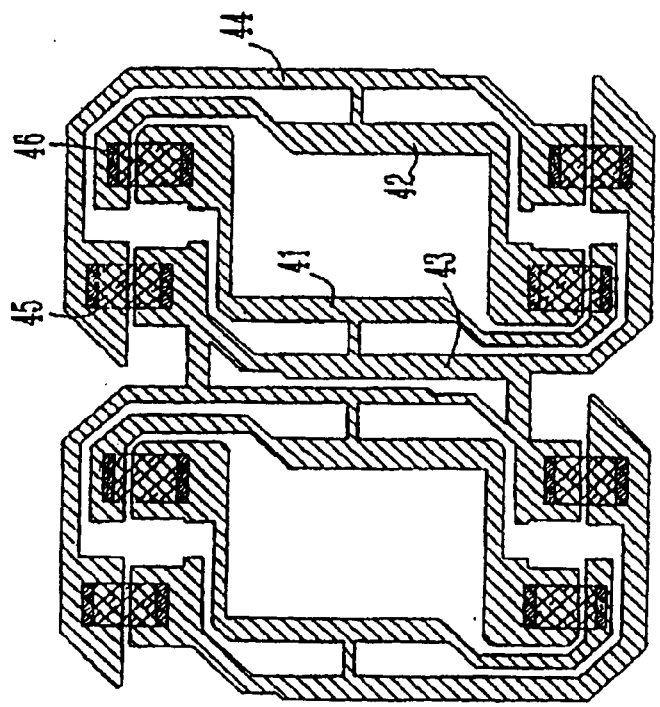
FIG. 4 discloses a method of improving current distribution with magic angle capacitors.
5.

FIG. 4 illustrates a possible method of achieving improved $B_1$ homogeneity, Q, and efficiency by improving the uniformity of the current density in a coil with magic angle capacitors. It comprises essentially an inner segmented loop 41, 42 and an outer segmented loop 43, 44 about the $B_1$ axis on each semicoil. The two loops in each semicoil are paralleled at one point in each azimuthal quadrant (in this case near the axial center) to suppress some unwanted modes. Otherwise, they are substantially magnetically coupled. The voltages across capacitors 45, 46 are nearly in phase, in contrast to the birdcage, in which their phases would differ by 90° when there are four capacitors at each end, for example. Since the inner loop has less inductance than the outer loop, the capacitors in the inner loop must be greater than the capacitors in the outer loop, and homogeneity depends critically on the capacitor ratios.

Figure 5:
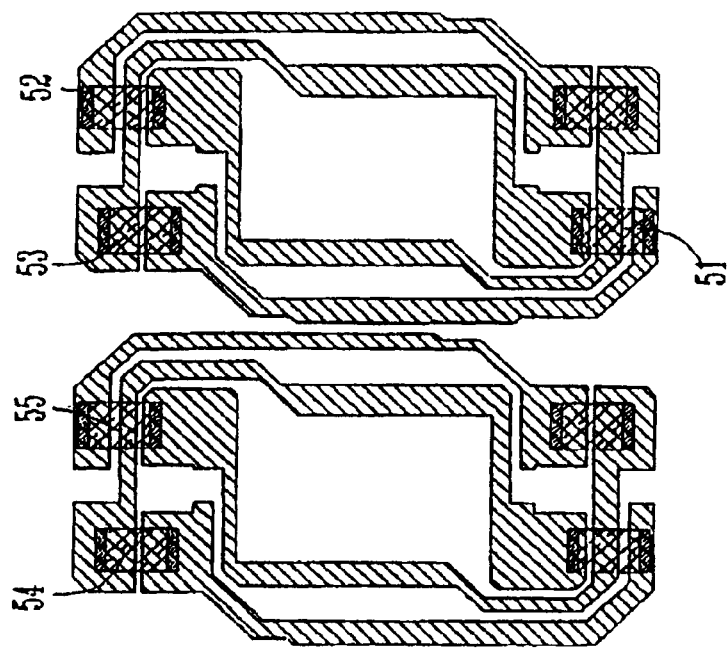
FIG. 5 discloses a preferred method of improving current distribution with magic angle capacitors.
6.

FIG. 5 illustrates a better method of improving $B_1$ homogeneity, Q, and efficiency by improving current distribution. Again each semicoil comprises essentially two segmented loops, but in this case they overlap. That is, insulated cross-overs occur at two points in each semicoil—under capacitors 51, 52, for example—somewhat like a litz foil coil as described in a copending application. This allows the inductances of the two loops to be equal, so all eight capacitors may be equal. Again, it is desirable to suppress as many unwanted modes as possible, but the simple connections near the 90° plane as in the previous coils are not as effective as another approach. If all loops are electrically isolated and all have equal voltage and phase relationships, tighter coupling (better suppression of false modes) may be achieved by simply paralleling the capacitor pairs 52, 53 and 54, 55 at one end on each semicoil (by eliminating the splits in the arcs at this end, similar to FIG. 2 at one end) and then connecting the pairs from the two semicoils in parallel using a pair of jumpers with a crossover (for correct phasing) between capacitors 55 and 53. However, repeating this paralleling at the opposite end would short the differential flux between the intersecting loops and nullify the intended objective of improving current distributions.

Figure 6:
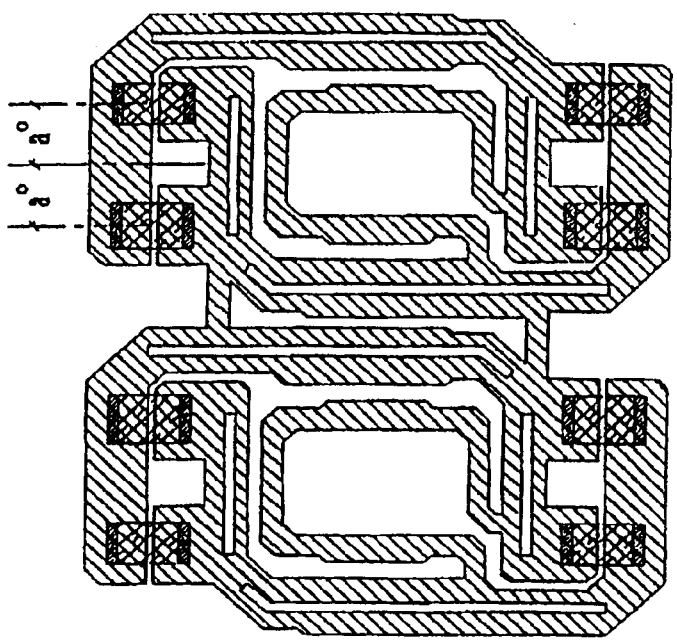
FIG. 6 illustrates the etched-half-turn fixed-frequency (EHTF) coil with magic angle capacitor mounting.

Finally, FIG. 6 illustrates yet another way to improve performance by driving an unsegmented low-inductance inner loop with half the total outer-loop voltage by connecting it across the gap at one corner of the outer loops. For best homogeneity when all capacitors are equal, the mean subtended angle of the inner loop will normally be about half the mean subtended angle of the outer loops, but other ratios will be optimum with other ratios of segmenting capacitors at opposite ends of the coil. This coil is similar to one disclosed in a copending application where it was called an etched-half-turn fixed-frequency (EHTF) coil, as, unlike most other coils in that application, it is not easily tuned over a wide range of frequencies. Tuning it without spoiling $B_1$ homogeneity requires simultaneous precise adjustment of four pairs of capacitors. However, it has the advantage of being much easier to double tune (for example, for $^1H$ and $^2H$ lock) than alternative HT coils.

What is claimed is:

1. An NMR probe for use in an external field $B_0$ in the z direction, said probe comprising:

a cylindrical dielectric coilform not aligned with the z axis, an rf coil wrapped around said coilform capable of producing $B_1$ perpendicular to the plane defined by the axis of said coilform and the z axis, said coil further characterized as comprising two substantially equivalent half-turn semicoils on opposite sides of said coilform, said half-turn semicoil characterized in that a major fraction of the total current around the $B_1$ axis in said semicoil is interrupted by series capacitances of comparable magnitude at exactly two locations in its path around the $B_1$ axis, said series capacitances each comprising two effectively paralleled capacitors wherein the rf voltage phase at said effectively paralleled tuning capacitors is substantially equal at the intended frequency of operation, said paralleled capacitors positioned individually at substantially equal axial and radial positions near each end of said semicoil, said rf coil further characterized in that the mean subtended azimuthal angle between said paralleled capacitors is greater than 50° and less than 100°.

2. The NMR probe of 1 further characterized in that each said capacitor is positioned at approximate azimuthal angle of ±35° with respect to the mean $B_1$ direction.

3. The NMR probe of 1 further characterized as including diamagentic leads attached to said capacitors, said leads further characterized as having mean magnetization comparable to the negative of that of said capacitors.

4. The NMR probe of 1 further characterized in that said capacitors are radially spaced outward from said coil by an amount greater than the minimum dimension of said capacitor.

5. The NMR probe of 1 further characterized in that said semicoil comprises two separately tuned segmented loops including an inner segmented loop of lesser inductance and an outer segmented loop of greater inductance.

6. The NMR probe of 1 further characterized in that said semicoil comprises two separately tuned segmented loops of equal inductance and insulated crossovers at the connections to two capacitors.

7. The NMR probe of 1 further characterized as including an unsegmented inner loop connected across one of said tuning capacitors.

* * * * *